US010192716B2

(12) United States Patent
Masnaghetti et al.

(10) Patent No.: US 10,192,716 B2
(45) Date of Patent: Jan. 29, 2019

(54) MULTI-BEAM DARK FIELD IMAGING

(71) Applicant: KLA-Tencor Corporation, Milpitas, CA (US)

(72) Inventors: Doug K. Masnaghetti, San Jose, CA (US); Mark A. McCord, Los Gatos, CA (US); Richard R. Simmons, Los Altos, CA (US); Rainer Knippelmeyer, Groton, MA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/245,911

(22) Filed: Aug. 24, 2016

(65) Prior Publication Data

US 2017/0084422 A1 Mar. 23, 2017

Related U.S. Application Data

(60) Provisional application No. 62/221,593, filed on Sep. 21, 2015.

(51) Int. Cl.
*H01J 37/244* (2006.01)
*H01J 37/28* (2006.01)
(52) U.S. Cl.
CPC ............ *H01J 37/244* (2013.01); *H01J 37/28* (2013.01); *H01J 2237/24465* (2013.01); *H01J 2237/2804* (2013.01)
(58) Field of Classification Search
CPC ......... H01J 37/3177; H01J 2237/31774; H01J 2237/24475; H01J 2237/24465; H01J 2237/2804; H01J 2237/2806; H01J 37/244; H01J 37/28
See application file for complete search history.

(56) References Cited

U.S. PATENT DOCUMENTS

| 6,774,646 | B1* | 8/2004 | Han | G01N 23/04 324/754.22 |
| 7,141,791 | B2 | 11/2006 | Masnaghetti et al. | |
| 7,171,038 | B2 | 1/2007 | Adler et al. | |
| 7,244,949 | B2 | 7/2007 | Knippelmeyer et al. | |
| 7,417,444 | B2* | 8/2008 | Shinada | G01R 31/305 250/309 |

(Continued)

FOREIGN PATENT DOCUMENTS

WO 2011011291 A1 1/2011

OTHER PUBLICATIONS

PCT International Search Report for International Application No. PCT/US2016/052526 dated Dec. 29, 2016, 3 pages.

*Primary Examiner* — Wyatt Stoffa
(74) *Attorney, Agent, or Firm* — Suiter Swantz pc llo

(57) ABSTRACT

Multi-beam scanning electron microscope (SEM) inspection systems with dark field imaging capabilities are disclosed. An SEM inspection system may include an electron source and at least one optical device. The at least one optical device may be configured to produce a plurality of primary beamlets utilizing electrons provided by the electron source and deliver the plurality of primary beamlets toward a target. The apparatus may also include an array of detectors configured to receive a plurality of image beamlets emitted by the target in response to the plurality of primary beamlets and produce at least one dark field image of the target.

21 Claims, 5 Drawing Sheets

(56) References Cited

U.S. PATENT DOCUMENTS

| | | | |
|---|---|---|---|
| 7,504,622 B2* | 3/2009 | Elyasaf | G01N 23/2251 250/306 |
| 7,554,094 B2 | 6/2009 | Knippelmeyer et al. | |
| 7,560,703 B1 | 7/2009 | Soltz et al. | |
| 7,638,777 B2* | 12/2009 | Feuerbaum | B82Y 10/00 250/310 |
| 7,705,301 B2 | 4/2010 | Tseng et al. | |
| 7,714,287 B1 | 5/2010 | James et al. | |
| 7,755,043 B1* | 7/2010 | Gubbens | H01J 37/244 250/306 |
| 7,838,833 B1* | 11/2010 | Lent | G01N 23/2251 250/310 |
| 8,039,813 B2 | 10/2011 | Casares et al. | |
| 8,097,847 B2 | 1/2012 | Knippelmeyer et al. | |
| 8,624,186 B2 | 1/2014 | Wang et al. | |
| 8,637,834 B2 | 1/2014 | Knippelmeyer et al. | |
| 9,224,576 B2 | 12/2015 | Knippelmeyer et al. | |
| 9,324,537 B2 | 4/2016 | Kemen et al. | |
| 9,336,981 B2 | 5/2016 | Knippelmeyer | |
| 9,384,938 B2 | 7/2016 | Zeidler et al. | |
| 2003/0156280 A1* | 8/2003 | Reinhorn | G01N 21/8806 356/237.2 |
| 2004/0026627 A1* | 2/2004 | Nakayama | H01J 37/244 250/397 |
| 2009/0114818 A1 | 5/2009 | Casares et al. | |
| 2009/0256075 A1 | 10/2009 | Kemen et al. | |
| 2010/0320382 A1* | 12/2010 | Almogy | H01J 37/05 250/307 |
| 2011/0278451 A1 | 11/2011 | Tiemeijer et al. | |
| 2012/0187293 A1 | 7/2012 | Shibata et al. | |
| 2013/0032729 A1 | 2/2013 | Knippelmeyer | |
| 2013/0187046 A1 | 7/2013 | Zeidler et al. | |
| 2014/0158902 A1 | 6/2014 | Knippelmeyer et al. | |
| 2014/0197322 A1 | 7/2014 | Eder et al. | |
| 2015/0008331 A1 | 1/2015 | Kemen et al. | |
| 2015/0034822 A1 | 2/2015 | Reinhorn et al. | |
| 2015/0179399 A1 | 6/2015 | Kruit et al. | |
| 2015/0270095 A1 | 9/2015 | Kruit | |
| 2017/0243717 A1* | 8/2017 | Kruit | H01J 37/28 |

* cited by examiner

MULTI-BEAM DARK FIELD IMAGING

CROSS-REFERENCE TO RELATED APPLICATIONS

The present application claims the benefit under 35 U.S.C. § 119(e) of U.S. provisional application Ser. No. 62/221,593 filed Sep. 21, 2015. Said U.S. provisional application Ser. No. 62/221,593 is hereby incorporated by reference in its entirety.

This application is related to co-pending and concurrently filed U.S. Patent Application No. 15/245,765, entitled "Backscattered Electrons (BSE) Imaging Using Multi-Beam Tools," listing Mark McCord, et al. as inventors, the entirety of which is incorporated herein by reference.

TECHNICAL FIELD

The disclosure generally relates to the field of inspection systems, and particularly to electron beam inspection systems.

BACKGROUND

Thin polished plates such as silicon wafers and the like are a very important part of modern technology. A wafer, for instance, may refer to a thin slice of semiconductor material used in the fabrication of integrated circuits and other devices. Wafers are subject to defect inspections, and scanning electron microscope (SEM) inspection is considered one of the most sensitive forms of defect inspection for wafers.

A scanning electron microscope (SEM) is a type of electron microscope that produces images of a target (e.g., a wafer) by scanning it with a focused beam of electrons. The electrons interact with atoms in the target, producing various signals that contain information about the surface topography and composition of the target. It is noted that the throughput of a SEM may be increased by increasing the number of focused beams of electrons (providing a SEM known as a multi-beam SEM). It is also noted, however, that currently available multi-beam SEMs do not support multi-beam dark field imaging.

SUMMARY

The present disclosure is directed to an apparatus. The apparatus may include an electron source and at least one optical device. The at least one optical device may be configured to produce a plurality of primary beamlets utilizing electrons provided by the electron source and deliver the plurality of primary beamlets toward a target. The apparatus may also include an array of detectors configured to receive a plurality of image beamlets emitted by the target in response to the plurality of primary beamlets and produce at least one dark field image of the target.

A further embodiment of the present disclosure is directed to an apparatus. The apparatus may include an electron source and at least one optical device. The at least one optical device may be configured to produce a plurality of primary beamlets utilizing electrons provided by the electron source and deliver the plurality of primary beamlets toward a target. The apparatus may also include an array of multi-channel detectors configured to receive a plurality of image beamlets emitted by the target in response to the plurality of primary beamlets and produce at least one dark field image of the target.

An additional embodiment of the present disclosure is directed to an apparatus. The apparatus may include an electron source and at least one optical device. The at least one optical device may be configured to produce a plurality of primary beamlets utilizing electrons provided by the electron source and deliver the plurality of primary beamlets toward a target. The apparatus may also include a high density detector array configured to receive a plurality of image beamlets emitted by the target in response to the plurality of primary beamlets and produce at least one dark field image of the target.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Embodiments in accordance with the present disclosure are directed to multi-beam scanning electron microscope (SEM) inspection systems with dark field imaging capabilities. Dark field imaging typically excludes unscattered beams from the rendered images (referred to as dark field images), which may help identify features that may not be visible in bright field images (e.g., raised features that are too smooth to cast shadows may not appear in bright field images, but the light that reflects off the sides of the feature will be visible in the dark field images). It is therefore contemplated that providing dark field imaging capabilities to multi-beam SEM inspection systems may be very effective and well suited for uses involving inspections of target samples such as wafers and the like.

Figure 1:
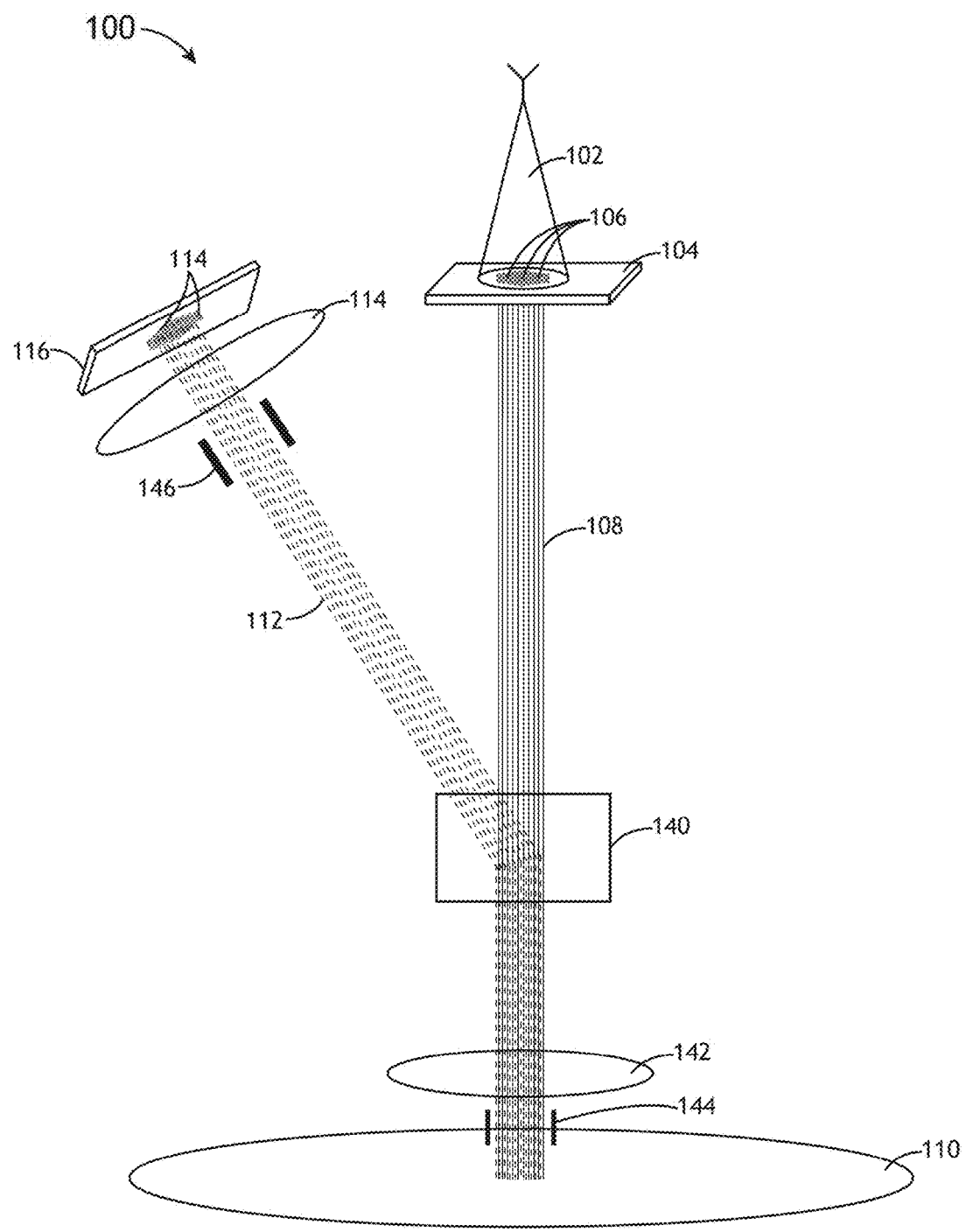
FIG. 1 is an illustration depicting a simplified multi-beam SEM inspection system.

Referring generally to FIG. 1, an illustration depicting a simplified multi-beam SEM inspection system 100 is shown. The multi-beam SEM inspection system 100 may include an electron source 102 configured to deliver electrons toward one or more optical devices 104. The optical device(s) 104 may be configured to produce a plurality of primary beamlets 108 utilizing the electrons provided by the electron source 102. The optical device(s) 104 may include, for example, a multi-beam aperture array that defines a plurality of apertures 106. The plurality of primary beamlets 108 produced by the plurality of apertures 106 may be delivered toward a target (e.g., a wafer) 110 to excite the atoms in the target 110, which in turn may emit a plurality of image beamlets 112 (including backscattered as well as secondary electron beamlets) that can be accelerated and/or filtered using one or more optical devices 114.

In some embodiments, the primary beamlets 108 are scanned by deflection optics in a raster pattern such that the perimeters of each beamlet raster pattern overlaps slightly with adjacent beamlet raster patterns so that a global image can be produced that is the aggregate of all beamlet images. Optics (e.g., a splitter 140) common to both the primary beamlets 108 and the image beamlets 112 may be provided between the optical device(s) 104 and the target 110 to help separate primary beamlets 108 and the image beamlets. An objective lens (e.g., a combination electro-static and magnetic objective lens) 142, common to both the primary beamlets 108 and the image beamlets 112, may also be provided close to the target 110.

In some embodiments, the image beamlets 112 may need to be corrected from primary raster deflection optics 144 using image path deflection plates 146 to cancel any residual transverse velocity components imparted by the primary scan deflection optics 144. The image beamlets 112 may eventually arrive at a detector array 116. The detector array 116 may include a plurality of detectors 118 designated (e.g., in a one-to-one correspondence manner) to receive the image beamlets 112. The plurality of detectors 118 may be utilized to render images of the target 110 at least partially based on the image beamlets 112 received at the detectors 118. In some embodiments, the images of the target 110 rendered by the plurality of detectors 118 may include dark field images.

Figure 3:
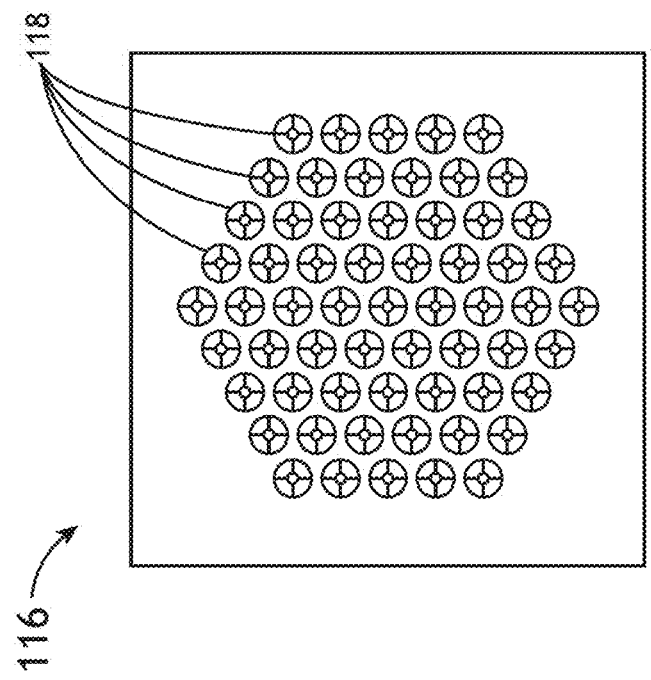
FIG. 3 is an illustration depicting a detector array utilizing multi-channel detectors configured in accordance with an embodiment of the present disclosure.
Figure 2:
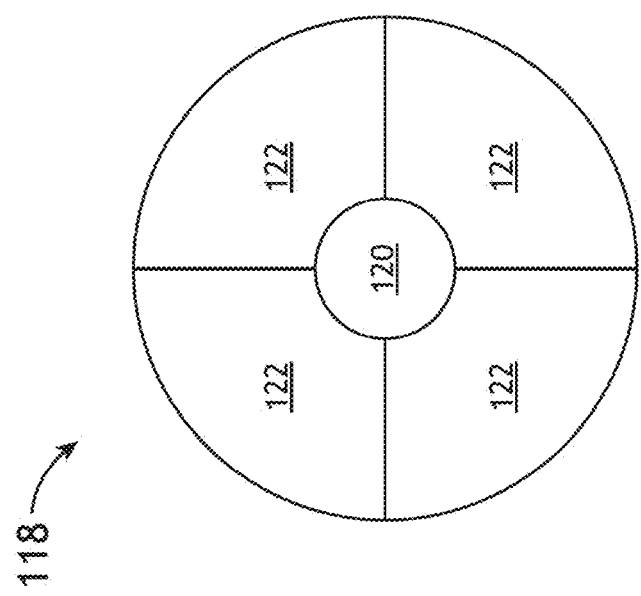
FIG. 2 is an illustration depicting a multi-channel detector configured in accordance with the present disclosure.

More specifically, the plurality of detectors 118 capable of rendering dark field images may be configured to provide multiple detector channels for each image beamlet 112. FIG. 2 is an illustration depicting a multi-channel detector 118 configured in accordance with the present disclosure and FIG. 3 is an illustration depicting a detector array 116 utilizing such multi-channel detectors 118.

As shown in FIG. 2, five (5) different detector channels 120 and 122 are defined in a given multi-channel detector 118. One of the channels defined in the multi-channel detector 118 is located at the center and may therefore be referred to as the center channel 120. The location of the center channel 120 may correspond to the particular image beamlet 112 the multi-channel detector 118 is designated to receive. The electron beamlet received at the center channel 120 may include a secondary electron beamlet that can be utilized to help render a bright field image of the target 110 in manners similar to that utilized in conventional multi-beam SEM inspection systems.

The multi-channel detector 118 also includes multiple detector channels 122 located around the center channel 120. These detector channels 122 may be referred to as outer channels 122, which may form a combined detection area (along with the center channel 120) that is sufficiently large to cover the image beamlet 112 expected to be received at the multi-channel detector 118. If the multi-channel detector 118 is a circular detector, for example, the diameter of the multi-channel detector 118 may be at least the diameter of the image beamlet 112. It is to be understood, however, that a circular detector is presented merely for illustrative purposes. It is contemplated that the multi-channel detector 118 may be configured to form various other shapes and sizes without departing from the spirit and the scope of the present disclosure.

Figure 5:
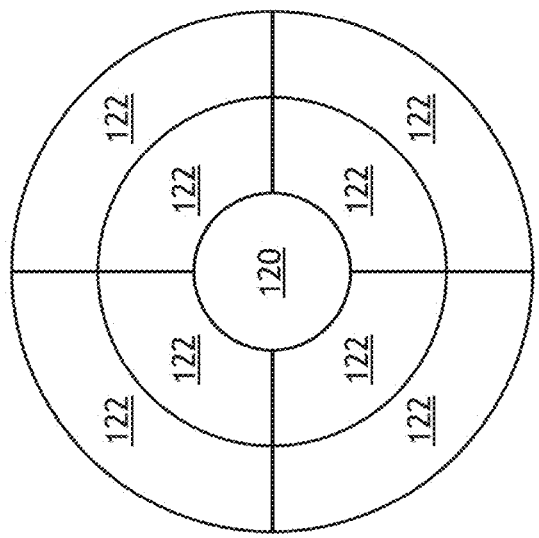
FIG. 5 is an illustration depicting another multi-channel detector configured in accordance with the present disclosure.
Figure 4:
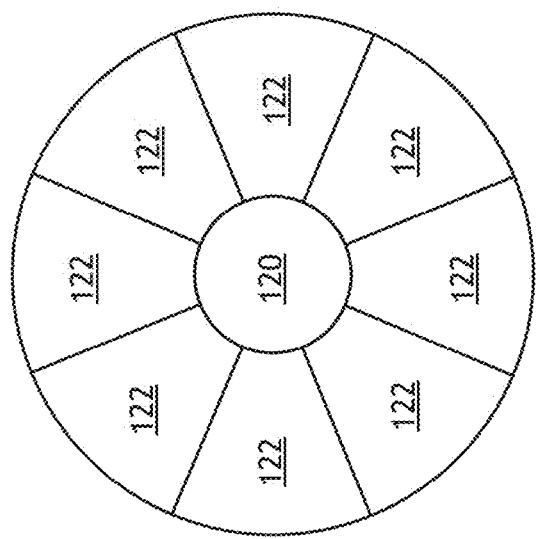
FIG. 4 is an illustration depicting another multi-channel detector configured in accordance with the present disclosure.

It is noted that the outer channels 122 of the multi-channel detector 118 are defined in the manner shown in FIG. 2 to help detect shadow information that can be used to render dark field images. It is contemplated that while four (4) outer channels 122 are depicted in FIG. 2, such a depiction is merely exemplary and is not meant to be limiting. It is contemplated that dark field imaging may be enabled with only two outer channels defined in a given multi-channel detector. It is also contemplated that more than four (4) outer channels 122 may be defined in a given multi-channel detector (e.g., as shown in FIGS. 4 and 5) to help collect more complete polar and azimuth angle information without departing from the spirit and the scope of the present disclosure.

It is to be understood that while the outer channels 122 can be utilized to help render dark field images, they may also be utilized to help render bright field images without departing from the spirit and the scope of the present disclosure. For example, bright field images may be formed by summing all channels, including center and outer channels. Dark field images can also be enhanced by subtracting opposite quadrants. It is contemplated that the various channels can be mixed. For instance, an image may be formed by subtracting opposite outer channels and adding a small percentage of the center channel.

It is also contemplated that the various channels provided in this manner can be utilized to quantify the image beam distribution on each segmented detector (e.g., by taking the ratio of center channel to the sum of the outer channels) in the detector array 116 and analyze how the metric changes across all detectors in the detector array 116 to obtain information about surface charging (e.g., the perimeter beams in the multi-image beam array may experience the highest lateral fields due to wafer charging, thus exhibit more image beam asymmetry as a result). It is contemplated that this information may be utilized to apply contrast and brightness corrections. This information may also be utilized (e.g., in a feedback control loop) to apply corrections to the primary or image beam optics if needed.

Figure 6:
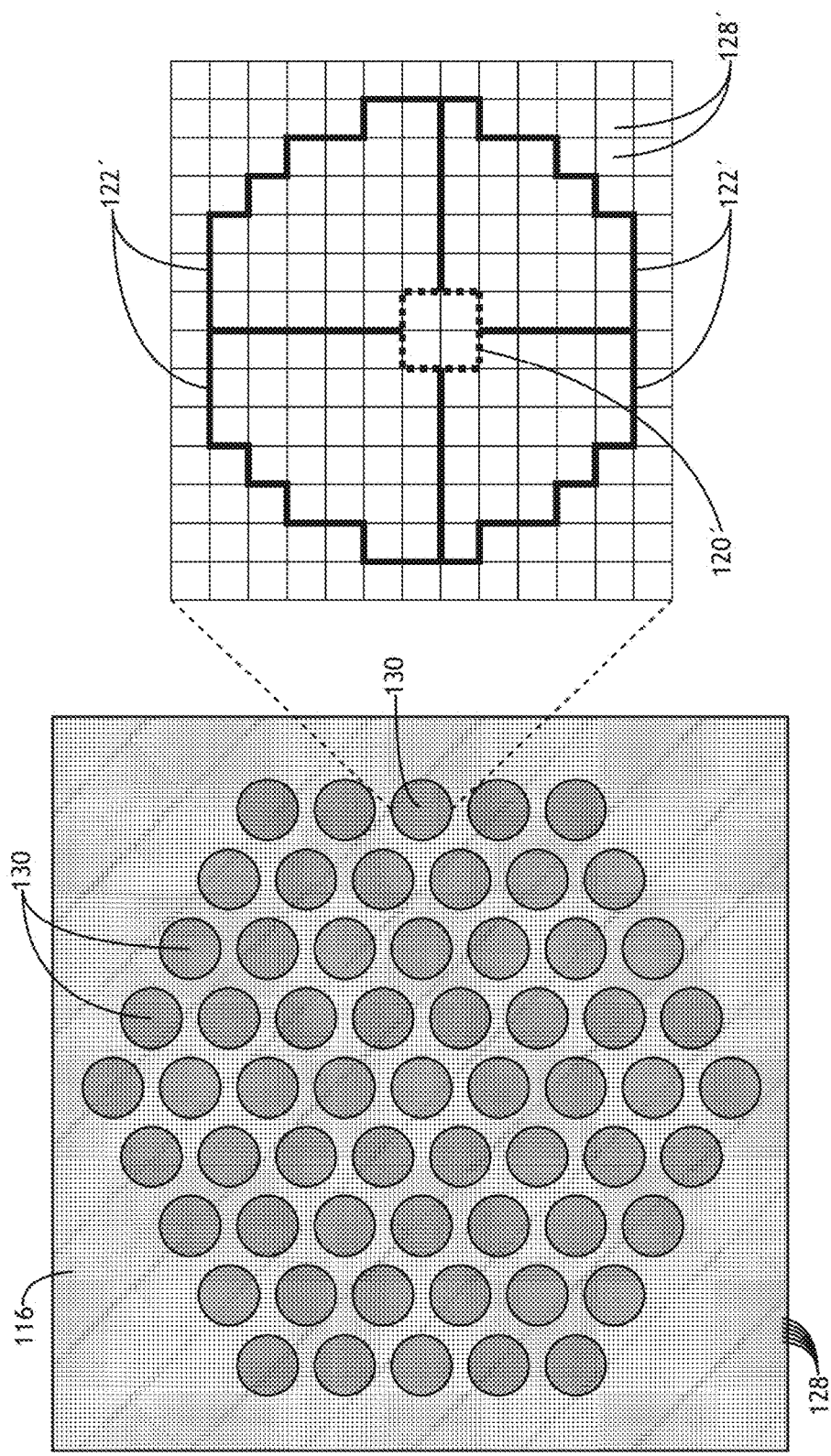
FIG. 6 is an illustration depicting a detector array configured in accordance with an embodiment of the present disclosure.

It is further contemplated that the inner and outer channels described above are not required to be defined entirely within individual detectors 118. FIG. 6 is an illustration depicting an alternative implementation of the detector array 116 that may be utilized to provide the same dark field imaging capabilities previously described. More specifically, as shown in FIG. 6, the detector array 116 may be implemented as a high density detector array that has a large number of detectors 128. The size of each individual detector 128 may be several times smaller than the area 130 where an individual image beamlet 112 is expected to cover, effectively allowing the detector array 116 to position a set of detectors 128 within each individual area 130. The set of detectors 128 positioned within each individual area 130 may then be logically partitioned/grouped into a plurality of channels in manners similar to that described above. For instance, a subset of the detectors 128 may be logically grouped to form a center partition 120 that functions in the same manner as the center channel 120 previously described. Similarly, one or more subsets of the detectors 128 may be logically grouped to form outer partitions 122 that function in the same manner as the outer channels 122 previously described.

It is to be understood that the logical partitions depicted in FIG. 6 are merely exemplary and are not meant to be limiting. It is contemplated that other partitions may be formed without departing from the spirit and the scope of the present disclosure. Regardless of the specific implementation of the detector array 116, however, it is contemplated that the detector array 116 configured in accordance with the present disclosure may provide the multi-beam SEM inspection system 100 the capabilities of rendering an array of dark field images to form a large contiguous dark field image of the target 110, which can be used for inspection, review, and metrology purposes. It is noted that the dark field images may also be used for the purposes of detecting defects that otherwise are difficult to detect. The polar and azimuth angle information collected utilizing a detector array 116 configured in accordance with the present disclosure may also be utilized to help render three-dimensional (3D) topology of the target 110 and/or to ascertain vertical distance to the target 110. It is contemplated that detector arrays configured in accordance with the present disclosure may provide other benefits not specifically mentioned above.

It is also contemplated that detector arrays (and multi-beam SEM inspection systems in general) configured in accordance with the present disclosure may be utilized as a part of, or in conjunction with, various types of inspection/detection systems/devices described in related U.S. patents and U.S. patent applications, including, but not limited to, U.S. patent application Ser. No. 14/115,326, entitled "Multi-spot Collection Optics", U.S. Pat. No. 7,504,622, entitled "High Throughput Multi Beam Detection System and Method", U.S. Pat. No. 7,141,791, entitled "Apparatus and Method for E-Beam Dark Field Imaging", U.S. Pat. No. 7,171,038, entitled "Method and Apparatus for Inspecting a Substrate", U.S. Pat. No. 7,560,703, entitled "Integrated Segmented Scintillation Detector", U.S. Pat. No. 7,705,301, entitled "Electron Beam Apparatus to Collect Side-View and/or Plane-View Image with In-Lens Sectional Detector", U.S. Pat. No. 7,714,287, entitled "Apparatus and Method for Obtaining Topographical Dark-Field Images in a Scanning Electron Microscope", U.S. Pat. No. 7,755,043, entitled "Bright-Field/Dark-Field Detector with Integrated Electron Energy Spectrometer", U.S. Pat. No. 7,838,833, entitled "Apparatus and Method for E-Beam Dark Imaging with Perspective Control", and U.S. Pat. No. 8,624,186, entitled "Movable Detector for Charged Particle Beam Inspection or Review", which are hereby incorporated by reference in their entireties.

Figure 7:
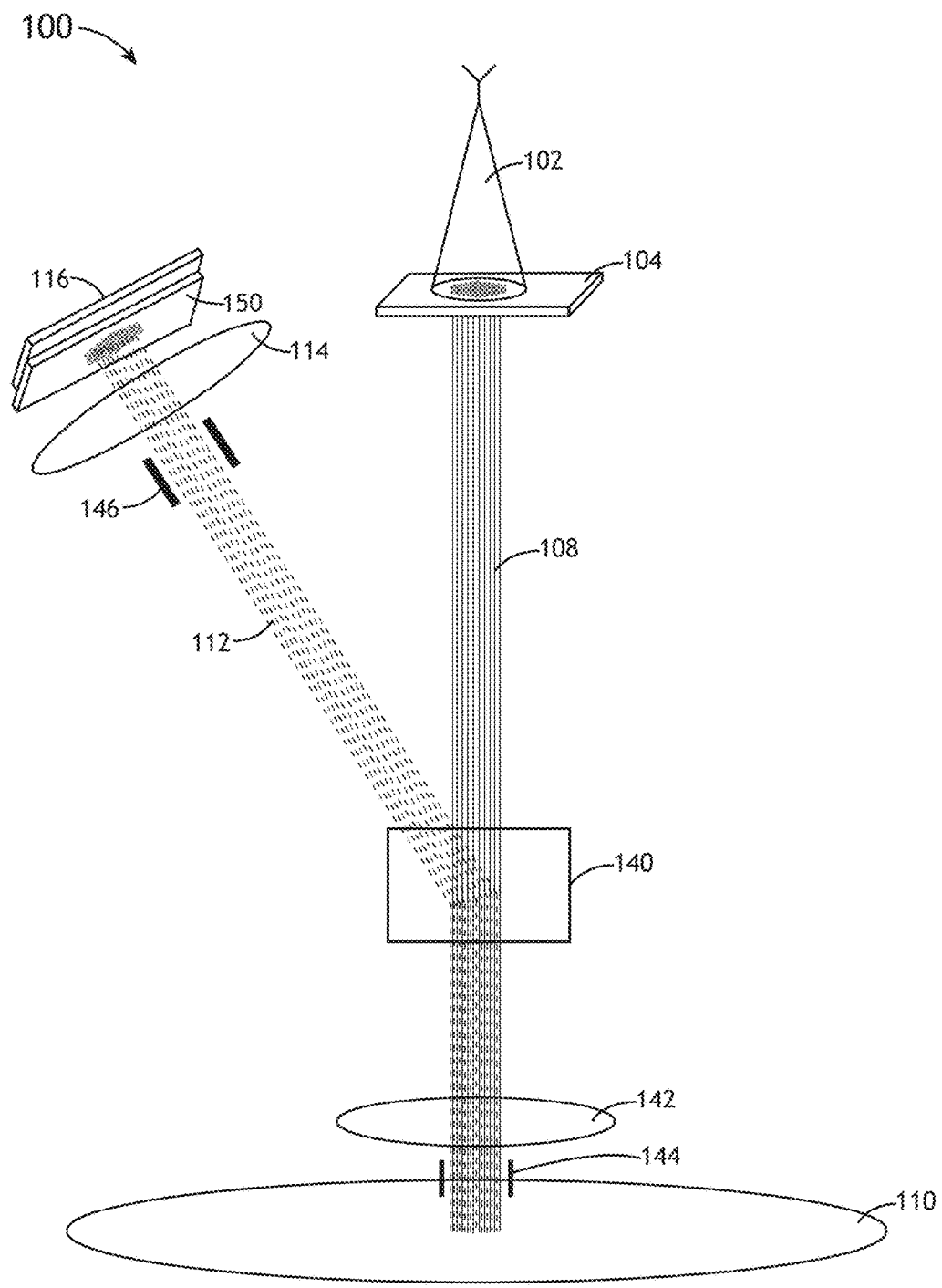
FIG. 7 is an illustration depicting another simplified multi-beam SEM inspection system.

It is further contemplated that detector arrays configured in accordance with the present disclosure may be utilized in conjunction with a lens array. As shown in FIG. 7, for example, a lens array 150 may be positioned in front of the detector array 116 to help control the image beam distribution on each multi-channel detector in the detector array 116. The lens array 150 allows the electrons in each image beamlet 112 to be manipulated without affecting the rate of divergence or convergence of the image beamlets 112 with respect to each other. For instance, the lens array 150 may be configured to direct more secondary electrons to the center channel of each detector without affecting beamlet pitch by increasing the focus power of the lens. In this manner, the lens array 150 in conjunction with the detector array 116 may function as an energy filter so that the lower energy secondaries can be preferentially focused to the center detector, effectively minimizing the number of lower energy secondaries in the outer channels. It is to be understood that such a feature may be useful for minimizing charging artifacts in dark field images (using outer channels only) because it is the lowest energy secondaries that are most greatly affected by wafer surface charging. It is also to be understood that the lens array 150 may be controlled globally (controls that are applicable to all lenses in the lens array 150) and/or discretely (controls that are applicable to each lens in the lens array 150) without departing from the spirit and scope of the present disclosure.

It is to be understood that while the examples above referred to a wafer as the subject of inspection, the inspection systems configured in accordance with the present disclosure are not limited to inspecting wafers. The inspection systems configured in accordance with the present disclosure are applicable to other types of subjects as well without departing from the spirit and scope of the present disclosure. The term wafer used in the present disclosure may include a thin slice of semiconductor material used in the fabrication of integrated circuits and other devices, as well as other thin polished plates such as magnetic disc substrates, gauge blocks and the like.

It is believed that the system and the apparatus of the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory.

What is claimed is:

1. An apparatus, comprising:
   an electron source;
   at least one optical device configured to produce a plurality of primary beam lets utilizing electrons provided by the electron source, the at least one optical device further configured to deliver the plurality of primary beam lets toward a target; and
   an array of multi-channel detectors configured to receive a plurality of image beam lets emitted by the target in response to the plurality of primary beamlets, the array of multi-channel detectors further configured to render an array of dark field images to form a contiguous dark field image, wherein each multi-channel detector of the array of detectors comprises a set of detector elements.

2. The apparatus of claim 1, wherein each image beamlet of the plurality of image beamlets is received by a designated multi-channel detector.

3. The apparatus of claim 1, wherein at least some of the multi-channel detectors comprise a center channel and a plurality of outer channels around the center channel.

4. The apparatus of claim 3, wherein the outer channels are further configured to collect polar and azimuth angle information to facilitate rendering of a three-dimensional topology of the target or to facilitate measurement of a vertical distance to the target.

5. The apparatus of claim 1, wherein the array of multi-channel detectors is a high density detector array.

6. The apparatus of claim 5, wherein each image beam let of the plurality of image beamlets is received by a set of detectors within the high density detector array.

7. The apparatus of claim 6, wherein at least one subset of the set of multi-channel detectors is grouped to form a center partition and at least two subsets of the set of multi-channel detectors are grouped to form at least two outer partitions.

8. The apparatus of claim 7, wherein the center partition and the outer partitions are configured to facilitate rendering of a bright field image of the target and a dark field image of the target.

9. The apparatus of claim 7, wherein the outer partitions are further configured to collect polar and azimuth angle information to facilitate rendering of a three-dimensional topology of the target or to facilitate measurement of a vertical distance to the target.

10. An apparatus, comprising:
an electron source;
at least one optical device configured to produce a plurality of primary beamlets utilizing electrons provided by the electron source, the at least one optical device further configured to deliver the plurality of primary beamlets toward a target; and
an array of multi-channel detectors configured to receive a plurality of image beamlets emitted by the target in response to the plurality of primary beamlets, the array of multi-channel detectors further configured to form a contiguous dark field image, wherein each multi-channel detector of the array of detectors comprises a set of detector elements.

11. The apparatus of claim 10, wherein each image beamlet of the plurality of image beamlets is received by a designated multi-channel detector.

12. The apparatus of claim 11, wherein at least some of the multi-channel detectors comprise a center channel and a plurality of outer channels around the center channel.

13. The apparatus of claim 12, wherein the multi-channel detector is configured to facilitate rendering of a bright field image of the target and a dark field image of the target.

14. The apparatus of claim 12, wherein the multi-channel detector is configured to quantify image beam distribution on the multi-channel detector to determine one or more applicable corrections.

15. The apparatus of claim 12, wherein the outer channels are further configured to collect polar and azimuth angle information to facilitate rendering of a three-dimensional topology of the target or to facilitate measurement of a vertical distance to the target.

16. The apparatus of claim 10, further comprising:
a lens array positioned in front of the array of multi-channel detectors, the lens array configured to facilitate control of the plurality of image beamlets receivable by the array of multi-channel detectors.

17. An apparatus, comprising:
an electron source;
at least one optical device configured to produce a plurality of primary beamlets utilizing electrons provided by the electron source, the at least one optical device further configured to deliver the plurality of primary beamlets toward a target; and
a high density detector array configured to receive a plurality of image beamlets emitted by the target in response to the plurality of primary beamlets, the high density detector array further configured to render an array of dark field images to form a contiguous dark field image.

18. The apparatus of claim 17, wherein each image beamlet of the plurality of image beamlets is received by a set of detectors within the high density detector array.

19. The apparatus of claim 18, wherein at least one subset of the set of detectors is grouped to form a center partition and at least two subsets of the set of detectors are grouped to form at least two outer partitions.

20. The apparatus of claim 19, wherein the center partition and the outer partitions are configured to facilitate rendering of a bright field image of the target and a dark field image of the target.

21. The apparatus of claim 19, wherein the outer partitions are further configured to collect polar and azimuth angle information to facilitate rendering of a three-dimensional topology of the target or to facilitate measurement of a vertical distance to the target.

* * * * *